(12) United States Patent
Kochetov

(10) Patent No.: US 10,389,327 B2
(45) Date of Patent: Aug. 20, 2019

(54) FILTER FOR IMPROVING THE ELECTROMAGNETIC COMPATIBILITY OF COMPONENTS OF AN ELECTRIC DRIVE OF A VEHICLE

(71) Applicant: Bayerische Motoren Werke Aktiengesellschaft, Munich (DE)

(72) Inventor: Sergey Kochetov, Munich (DE)

(73) Assignee: Bayerische Motoren Werke Aktiengesellschaft, Munich (DE)

(*) Notice: Subject to any disclaimer, the term of this patent is extended or adjusted under 35 U.S.C. 154(b) by 193 days.

(21) Appl. No.: 15/463,579

(22) Filed: Mar. 20, 2017

(65) Prior Publication Data

US 2017/0194929 A1   Jul. 6, 2017

Related U.S. Application Data

(63) Continuation of application No. PCT/EP2015/072813, filed on Oct. 2, 2015.

(30) Foreign Application Priority Data

Nov. 3, 2014   (DE) ........................ 10 2014 222 363

(51) Int. Cl.
| | |
|---|---|
| *B60R 16/02* | (2006.01) |
| *H03H 7/06* | (2006.01) |
| *H03H 1/00* | (2006.01) |
| *H04B 3/30* | (2006.01) |
| *B60L 1/00* | (2006.01) |
| *B60R 16/023* | (2006.01) |

(52) U.S. Cl.
CPC ............... *H03H 7/06* (2013.01); *B60L 1/00* (2013.01); *B60R 16/0215* (2013.01); *H03H 1/0007* (2013.01); *H04B 3/30* (2013.01); *B60L 2270/147* (2013.01); *B60R 16/0232* (2013.01)

(58) Field of Classification Search
USPC ........................................................ 307/10.1
See application file for complete search history.

(56) References Cited

FOREIGN PATENT DOCUMENTS

| | | |
|---|---|---|
| DE | 195 45 559 A1 | 7/1996 |
| DE | 196 36 816 A1 | 3/1998 |

(Continued)

OTHER PUBLICATIONS

International Search Report (PCT/ISA/210) issued in PCT Application No. PCT/EP2015/072813 dated Dec. 21, 2015 with English translation (seven pages).

(Continued)

*Primary Examiner* — Rexford N Barnie
*Assistant Examiner* — Xuan Ly
(74) *Attorney, Agent, or Firm* — Crowell & Moring LLP

(57) ABSTRACT

A damping device is designed to dampen noise signals in a cable having a plurality of wires. The damping device includes a plurality of first terminals, to which is applied the voltage vector $U_1$ and where the current vector $I_1$ flows, a wire of the cable being connected to each first terminal; a plurality of second terminals, to which is applied the voltage vector $U_2$ and where the current vector h flows, a wire of the cable being connected to each second terminal; and a first plurality of dipoles, whose first terminal is connected to the wire k and whose second terminal is connected to ground.

12 Claims, 8 Drawing Sheets

(56) References Cited

FOREIGN PATENT DOCUMENTS

| DE | 19636816 | * | 3/1998 |
|----|----------|---|--------|
| DE | 10 2004 056 305 A1 | | 7/2005 |
| DE | 102004056305 | * | 7/2005 |
| EP | 0 274 347 A1 | | 7/1988 |
| EP | 1 126 573 A2 | | 8/2001 |
| JP | 2007-318734 | * | 12/2007 |
| JP | 2007-318734 A | | 12/2007 |

OTHER PUBLICATIONS

German-language Written Opinion (PCT/ISA/237) issued in PCT Application No. PCT/EP2015/072813 dated Dec. 21, 2015 (eight pages).
German Office Action issued in counterpart German Application No. 10 2014 222 363.6 dated Oct. 14, 2015 (six pages).

* cited by examiner

FILTER FOR IMPROVING THE ELECTROMAGNETIC COMPATIBILITY OF COMPONENTS OF AN ELECTRIC DRIVE OF A VEHICLE

CROSS REFERENCE TO RELATED APPLICATIONS

This application is a continuation of PCT International Application No. PCT/EP2015/072813, filed Oct. 2, 2015, which claims priority under 35 U.S.C. § 119 from German Patent Application No. 10 2014 222 363.6, filed Nov. 3, 2014, the entire disclosures of which are herein expressly incorporated by reference.

BACKGROUND AND SUMMARY OF THE INVENTION

The present application relates to an improved damping device which improves the electromagnetic compatibility of components of an electrically driven vehicle.

Electric drives can be used in a vehicle with a hybrid drive or with an exclusively electric drive. In the case of an electric drive, the electromagnetic compatibility (EMC) must be ensured so that other components inside and outside the vehicle are not disrupted.

The measures known from the prior art for improving the electromagnetic compatibility for high-voltage networks in a vehicle with an electric drive are not satisfactory. A conventional EMC filter serves primarily to damp interference signals which are emitted by an active electrical device, for example an inverter, a DC/DC converter and the like. That is to say the function of the filter is to damp a source of interference. In addition to filtered and damped power electronics, a motor vehicle contains further sources of interference which do not always satisfy the requirements of the CE standard. Therefore, in a motor vehicle there may be interference even though the power electronics do not generate any emissions. The resonances in connecting structures, in particular in the cable harnesses, amplify the emissions at certain frequencies. In some configurations, this effect can be significant since the resonances in the connecting structures can cause an interference signal to be radiated by the entire motor vehicle.

Conventional EMC filters do not damp any cable harness resonances which are external with respect to an electrical device.

EP 0 274 347 A1 discloses a series circuit of a resistor and of a capacitor which are each connected between a line and ground.

DE 196 36 816 A1 discloses a ferrite reactor, and discloses that lines are connected to ground via a series circuit composed of a resistor and a capacitor, in order to adapt the wave impedance.

The invention has the object of providing an improved damping device and an improved method for configuring a damping device.

The object of the invention is achieved by a damping device, a motor vehicle having such a damping device, as well as a method of operating the damping device, in accordance with embodiments of the invention.

A damping device according to the invention is designed to damp interference signals in a cable having a plurality of wires and comprises a plurality of first terminals to which the voltage vector $U_1$ is applied and at which the current vector $I_1$ flows, wherein a wire of the cable harness is connected to every first terminal, and a plurality of second terminals to which the voltage vector $U_2$ is applied and at which the current vector $I_2$ flows, wherein a wire of the cable harness is connected to each second terminal. The damping device comprises a first plurality of dipoles $Z_{kk}$ whose first terminal is connected to the wire k and whose second terminal is connected to ground, and optionally a second plurality of dipoles $Z_{km}$ whose first terminal is connected to the wire k and whose second terminal is connected to the wire m.

The following applies:

$$\overline{A} = \begin{pmatrix} \overline{A}_{11} & \overline{A}_{12} \\ \overline{A}_{21} & \overline{A}_{22} \end{pmatrix},$$

where the following applies $$\begin{pmatrix} \overline{U_1} \\ \overline{I_1} \end{pmatrix} = \begin{pmatrix} \overline{A}_{11} & \overline{A}_{12} \\ \overline{A}_{21} & \overline{A}_{22} \end{pmatrix} \cdot \begin{pmatrix} \overline{U_2} \\ \overline{I_2} \end{pmatrix};$$

$$\overline{Y}_w = \sqrt{\overline{A}_{21}\overline{A}_{12}^{-1}} = \{y_{km}\}, k, m = \overline{1, n};$$

the admittance matrix, and;

$\overline{Y}_w$ the admittance matrix, and;

$\overline{A}$ is the chain matrix of the cable.

The resistance and the reactance of the dipoles $Z_{km}$, $Z_{kk}$ are determined as follows:

$$Z_{k,m} = \begin{cases} -\dfrac{1}{y_{k,m}}, & k \neq m, \\ 1 \Big/ \displaystyle\sum_{i=1:n} y_{k,i}, & k = m. \end{cases}$$

The cable can be a cable harness, for example a cable harness of an electrically driven motor vehicle. The damping device has the topology of an impedance matrix with a capacitive and an inductive isolation in the lower frequency range which serves to avoid interference with a function in the lower frequency range. The entire circuit of the damping device comprises N!/(2×(N−2)! modal wave impedances which are connected between preferably all the cable wires and all the cable shield sleeves, but a large part of these impedances can be reduced or eliminated, since not all the resonance modes have to be damped.

One of the wires of the cable can be a first shield which shields at least one other wire. The first shield can be connected to ground via a dipole $Z_{kk}$, and the wires of the cable can each be connected to the first shield via a dipole $Z_{km}$. In another embodiment, the first shield can be connected to a second shield via a dipole $Z_{kk}$ and the wires of the cable can each be connected to the first shield via a dipole $Z_{km}$. The electromagnetic behavior of the cable and of the electrical devices connected thereto can be improved by the shields and the shielding of individual wires or of a plurality of wires by means of a shield. The damping device can have an inductance which is connected to a wire of the cable. In particular, the inductance can be connected in series with the wire. Alternatively or additionally, the damping device can have a component which acts as an inductance, for example an SMD ferrite or a CM core, and is arranged around a plurality of wires of the cable. Alternatively to this or in addition, the damping device comprises a component which acts as an inductance and is arranged around all the wires of the cable apart from the second shield.

If the modal wave impedances are greater than or comparable to input impedances, SMD ferrites or CM/DM ferrite cores can be used for the inductive isolation. This ensures that the input impedances which are connected in parallel cannot influence the damping of the resonance. The selection of a specific isolation measure depends on the different types of filter and on the EMC filter concept which is used.

The invention also relates to a motor vehicle having an electric drive and the damping device described above.

The first shield can be a cable harness ground, and the second shield can be a housing shield which is connected to the bodywork.

In another embodiment, the dipoles $Z_{kk}$ can be connected to the first shield and each wire can be coupled to the first shield by means of a second capacitance, wherein in every wire an inductance is connected between the dipole and the second capacitance. This type of wave damping is advantageous, in particular, in the case of a low-voltage signal cable harness.

In comparison with the wave impedances in the frequency range in which the cable resonances take place, the inductance preferably has a high resistance, and the capacitor preferably has a low resistance.

The invention also relates to a method for determining the resistance and the reactance of dipoles ($Z_{km}$, $Z_{kk}$) of a damping device for a cable having a plurality of wires, wherein the damping device has a plurality of first terminals to which the voltage vector $U_1$ is applied and at which the current vector $I_1$ flows, wherein a wire of the cable harness is connected to every first terminal, a plurality of second terminals to which the voltage vector $U_2$ is applied and at which the current vector $I_2$ flows, wherein a wire of the cable harness is connected to every second terminal, a first plurality of dipoles $Z_{kk}$ whose first terminal is connected to the wire k and whose second terminal is connected to ground, and an optional second plurality of dipoles $Z_{km}$ whose first terminal is connected to the wire k and whose second terminal is connected to the wire m.

The expression ground within the scope of this patent application also comprises a local ground, for example a housing ground or a shield ground or a housing shield ground.

The method comprises the step of determining the S parameters of the cable by way of a measurement or a computer-implemented calculation or simulation. S parameters can include the control parameters. The chain matrix A can be calculated from the S parameters. The S parameters can be determined by a commercially available network analyzer. The S parameter matrix can be converted into a chain matrix A by formulas which are known to a person skilled in the art. The following applies:

$$\overline{A} = \begin{pmatrix} \overline{A}_{11} & \overline{A}_{12} \\ \overline{A}_{21} & \overline{A}_{22} \end{pmatrix} \text{ and}$$

$$\begin{pmatrix} \overline{U_1} \\ \overline{I_1} \end{pmatrix} = \begin{pmatrix} \overline{A}_{11} & \overline{A}_{12} \\ \overline{A}_{21} & \overline{A}_{22} \end{pmatrix} \cdot \begin{pmatrix} \overline{U_2} \\ \overline{I_2} \end{pmatrix};$$

The admittance matrix $\overline{Y}$ is determined by the following equation:

$$\overline{Y}_w \sqrt{\overline{A}_{21} \overline{A}_{12}^{-1}} = \{y_{km}\}, \quad k,m = \overline{1,n};$$

where $\overline{A}_{21}$ has as a unit an impedance and $\overline{A}_{21}$ has as a unit the admittance, which are each extracted from the chain matrix, and $\overline{Y}_w$ is a modal admittance matrix. The resistance and the reactance of the dipoles $Z_{km}$, $Z_{kk}$ can be determined by the following equations:

$$Z_{k,m} = \begin{cases} -\dfrac{1}{y_{k,m}}, & k \neq m, \\ 1 \Big/ \sum_{i=1:n} y_{k,i}, & k = m. \end{cases}$$

The approaches to damping common-mode resonances and differential-mode resonances for networks or cables known in the prior art are based on a scalar formulation of the wave impedances without taking into account the intermediate effects of the impedances owing to a parallel connection of common-mode impedances and differential-mode impedances. The circuits used in the prior art do not form an entire matrix and cannot damp all the resonance modes. The inventor has recognized that this problem can be solved by modal formulation of the wave impedance which can be represented as a network.

The damping device which is disclosed can take into account the resonances and the modes of a cable or of a cable harness and ensures that the cable or the cable harness emits or receives less interference. The damping devices of the prior art have hitherto merely taken into account the properties of an electrical device that was damped, but have not sufficiently taken into account the cable harness or the cable.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
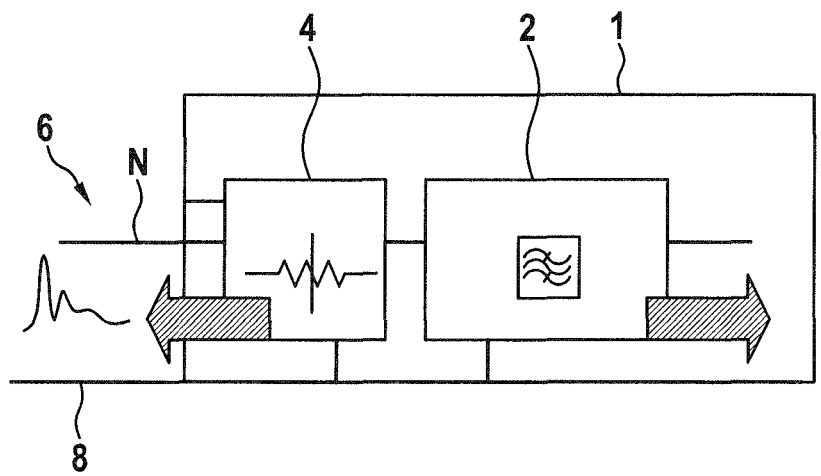
FIG. 1 is a system circuit diagram of an electrical device with respect to the damping of interference signals.

Reference is made to FIG. 1 which shows a system circuit diagram of an electrical device with respect to the damping of interference signals. The electrical device 1 has an EMC filter 2 which is connected to ground 8 and to N wires of a cable harness 6. An inventive damping device 4 is connected between the EMC filter 2 and the cable harness 6. The EMC filter 2 is designed to damp the electrical device 1 toward the inside. Consequently, properties of the electrical device 1 are taken into account in the design of the EMC filter 2. The damping device 4 is designed to damp the electrical device 1 toward the outside. Consequently, properties of the surroundings of the electrical device 1, for example of the cable harness 6, are taken into account in the design of the damping device 4.

Figure 2:
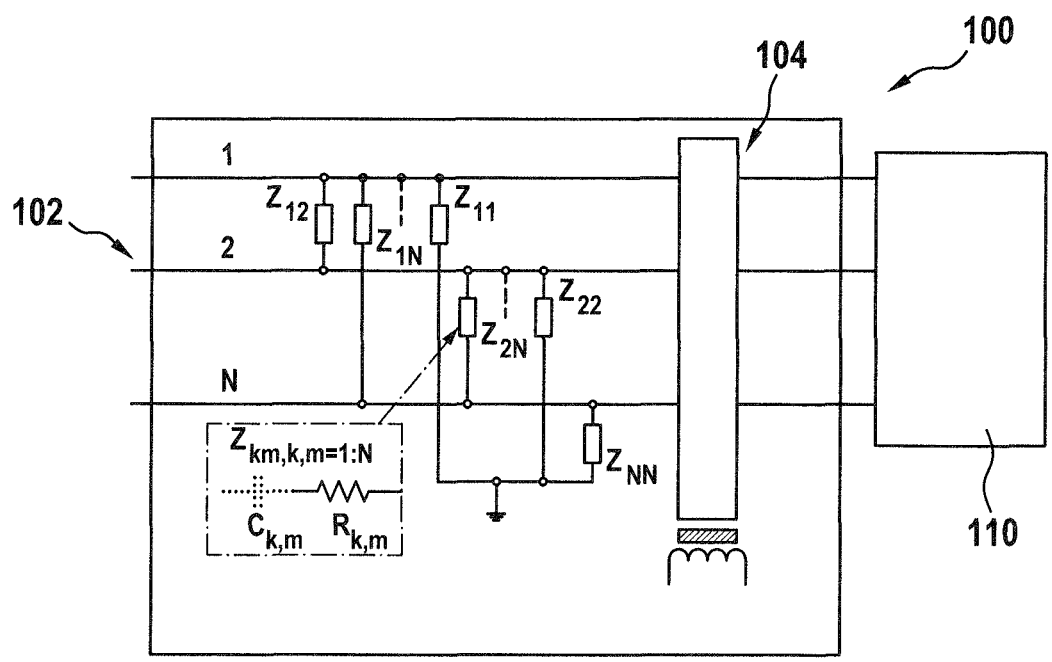
FIG. 2 is a general structure diagram of a modal wave damper.

FIG. 2 shows a general embodiment of a damping device 100 according to the invention. A cable 102 with a plurality of wires 1 to N is connected to the damping device 100. A first plurality of dipoles $Z_{11}$, $Z_{22}$ and $Z_{NN}$ is connected from one wire in each case to ground. A second plurality of dipoles $Z_{12}$, $Z_{1N}$ and $Z_{2N}$ is connected from wire to wire. An inductive isolator device 104, which can have, for example, SMD ferrites, is also connected into the cable 102. The actual electrical device 110 is connected to the inductive isolator device 104. The values of the dipoles $Z_{km}$ and $Z_{kk}$ are calculated by determining the scatter parameters (S parameters) by way, for example, of a network analyzer. The scatter parameters of the cable can also be determined by a computer-assisted simulation.

A chain matrix (A parameter) is used to calculate the real and complex resistances of the dipoles Z:

$$\overline{\overline{A}} = \begin{pmatrix} \overline{A}_{11} & \overline{A}_{12} \\ \overline{A}_{21} & \overline{A}_{22} \end{pmatrix},$$

where the following applies $$\begin{pmatrix} \overline{U_1} \\ \overline{I_1} \end{pmatrix} = \begin{pmatrix} \overline{A}_{11} & \overline{A}_{12} \\ \overline{A}_{21} & \overline{A}_{22} \end{pmatrix} \cdot \begin{pmatrix} \overline{U_2} \\ \overline{I_2} \end{pmatrix}; \text{ and }$$

$$\overline{\overline{Y}}_w = \sqrt{\overline{\overline{A}}_{21} \overline{\overline{A}}_{12}^{-1}} = \{y_{km}\}, k, m = \overline{1, n}.$$

The values of the dipoles $Z_{km}$ and of the dipoles $Z_{kk}$ can be calculated as follows:

$$Z_{k,m} = \begin{cases} -\dfrac{1}{y_{k,m}}, & k \neq m, \\ 1 \Big/ \sum_{i=1:n} y_{k,i}, & k = m. \end{cases}$$

The S parameters are determined, as was mentioned above, by use of a vector network analyzer. The term $y_M$ denotes elements of the modal impedance matrix $Y_w$. As has been mentioned above, the matrix $\overline{A}_{21}$ has the impedance as a unit, and the matrix $\overline{A}_{21}$ has the admittance as a unit. The dipoles $Z_{km}$, $Z_{kk}$ are to be used only if the modal wave impedances are lower than or in the region of the input impedances, for example in the case of an IC input or a cable shield against a cable sleeve. If the modal wave impedances are greater than or in the region of the input impedances, inductive isolation must be provided by way of an inductance, for example an SMD ferrite or a common-mode/differential-mode ferrite core. This ensures that the input impedances which are connected in parallel cannot influence the damping of the resonance.

Figure 3:
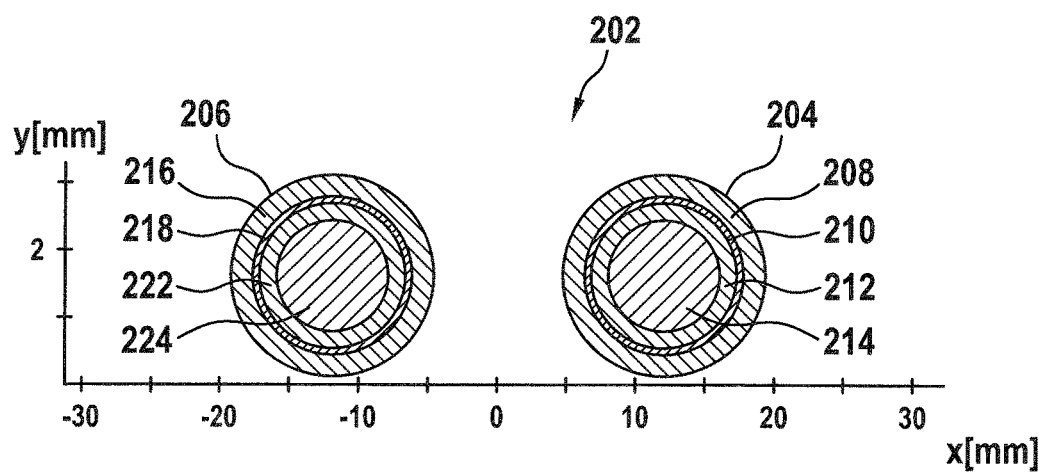
FIG. 3 shows a section through a high-voltage direct current line.
Figure 4:
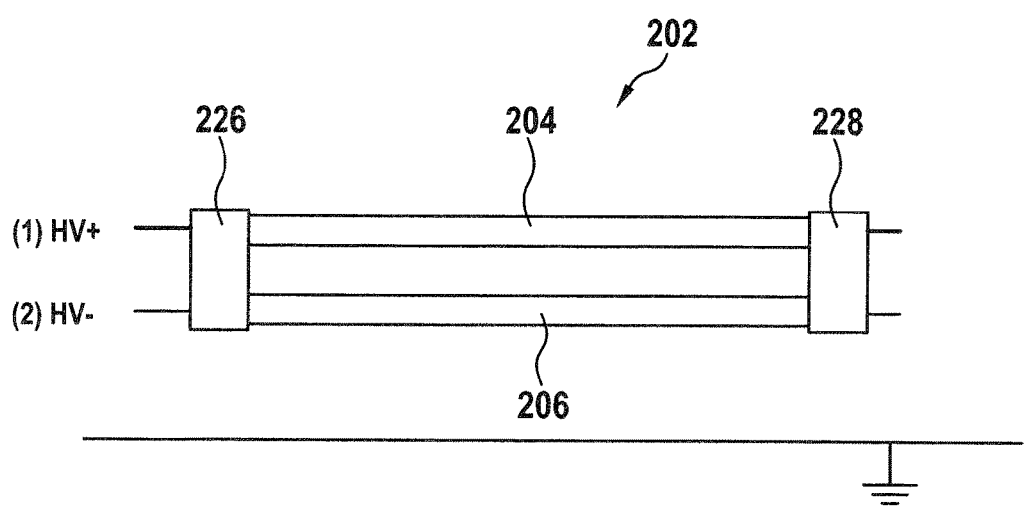
FIG. 4 shows a schematic plan view of a high-voltage direct current line.
Figure 5:
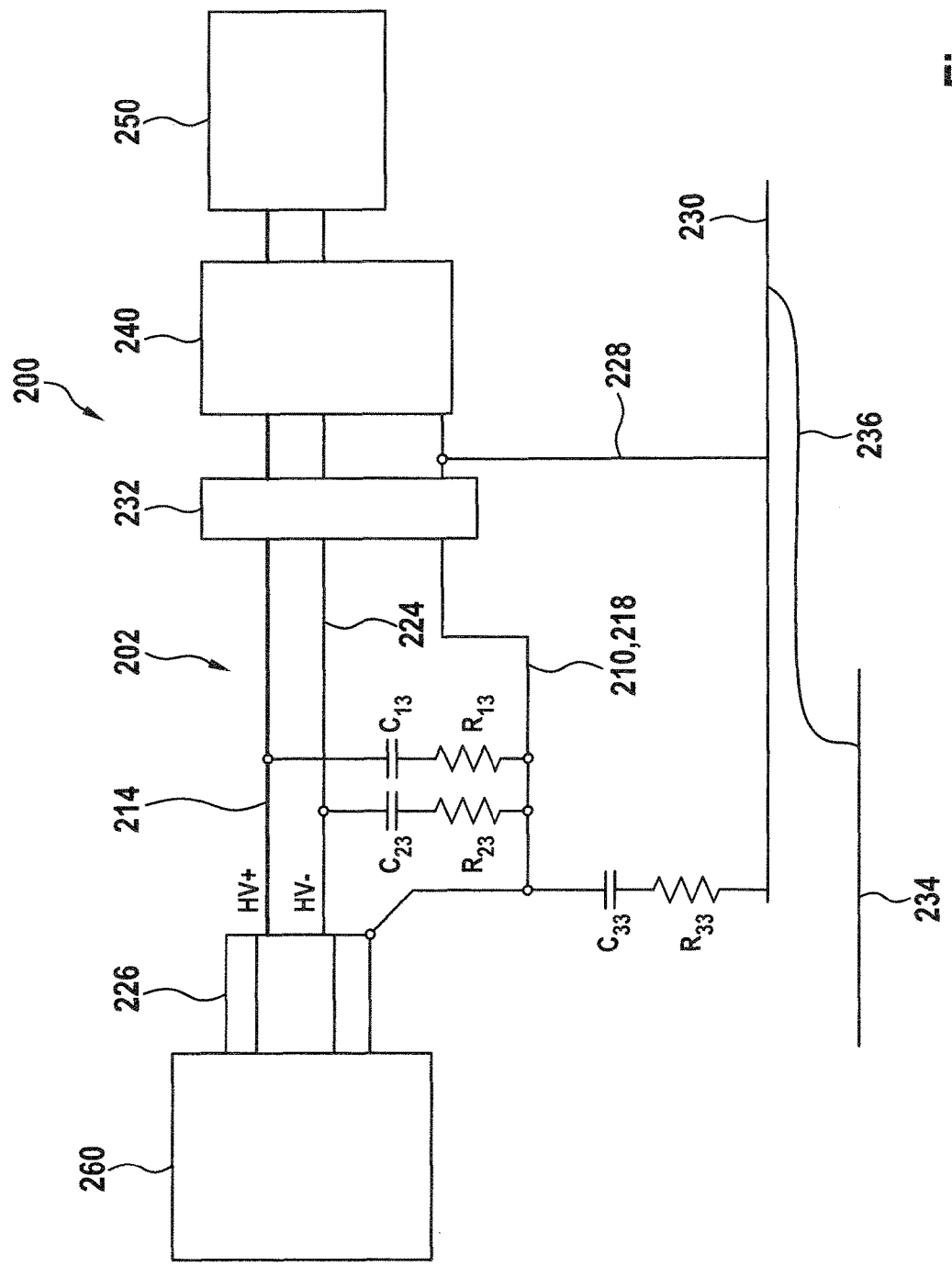
FIG. 5 is a circuit diagram of a damping device for a high-voltage direct current line.

Reference is made to FIGS. 3, 4 and 5 which show a damping device 200 for a high-voltage DC line 202, with FIG. 3 showing a cross section through a first line element 204 and a second line element 206 of the high-voltage DC line 202, FIG. 4 showing a plan view of the high-voltage DC line 202, and FIG. 5 showing the damping device 200.

The damping device 200 for the high-voltage DC line 202 is an important element of the entire filter topology which damps resonances in a traction network. The high-voltage DC line 202 comprises two line elements 204, 206 each with a wire 214, 224. Since the shield sleeves 208, 216 are connected by plugs 226, 228, the high-voltage DC line 202 can be described as a 3×3 matrix of modal wave impedances. In the case of a high-voltage DC line, the wave impedance matrix does not have to be fully occupied in order to determine the values of the dipoles of the damping device 200 because a low differential impedance of an intermediate circuit capacitor on the power electronics side or the impedance of the cells of a high-voltage accumulator can only be avoided with difficulty. Nevertheless, it is possible with the approach according to the invention to damp all three common-mode resonance modes (total system resonances) efficiently. It goes without saying that this calculation has to be carried out separately for each cable model and/or for each type of routing in the vehicle.

A plug 226 is connected to a power electronics device 260. A first wire 214 and a second wire 224 are connected to the plug 226. The wires 214 and 224 are connected to a battery 250 via a ferrite core 232 and a conventional high-voltage filter 240. The high-voltage DC line 202 comprises an environmental insulation sleeve 208, an individual shield 210, an insulator element 212 and the wire 214, for example with a cross section of 35 mm2. The ferrite core 232 surrounds all the lines and generates impedances of approximately 300 Ωat a frequency of approximately 10 MHz up to approximately 30 MHz.

The first wire 214 is connected to a cable harness shield ground 210, 218 via a capacitor $C_{13}$ and a resistor $R_{13}$ connected in series. The second wire 224 is connected to the cable harness shield ground 210, 218 via a capacitor $C_{23}$ and a resistor $R_{32}$ connected in series. The cable harness shield ground is connected to the high-voltage filter 240 via the ferrite core 232.

The cable harness shield ground 210, 218 is also connected to the plug 226. The cable harness shield ground 210, 218 can consequently be considered to be a wire of the cable 202. The cable harness shield ground 210, 218 is connected to the housing shield ground 230 via a capacitor $C_{33}$ and a resistor $R_{33}$. The housing shield ground 230 is connected to the high-voltage filter 240 via the housing ground 228, and to the cable harness shield ground 210, 218 via the ferrite core 232. The housing shield ground is connected via a cable 236 to the bodywork 234 which forms the actual ground of the vehicle.

The scatter matrix for the line 202 is constructed as follows:

|  |  |  |  |  |  |
|---|---|---|---|---|---|
| −10.1560 | −3.9032 | −3.7713 | −12.9042 | −32.0056 | −24.7212 |
| −3.9032 | −10.1560 | −3.7713 | −32.0056 | −12.9042 | −24.7212 |
| −3.7713 | −3.7713 | −9.0316 | −24.7212 | −24.7212 | −16.8940 |
| −12.9042 | −32.0056 | −24.7212 | −10.1560 | −3.9032 | −3.7713 |
| −32.0056 | −12.9042 | −24.7212 | −3.9032 | −10.1560 | −3.7713 |
| −24.7212 | −24.7212 | −16.8940 | −3.7713 | −3.7713 | −9.0316 |

Unit: dB

As a result, the following values are obtained for the resistances and capacitances:
$R_{13} = R_{23} = 7\,\Omega$, $R_{33} = 122\,\Omega$, $C_{13} = C_{23} = C_{33} = 10$ nF, where the admittance matrix has the following values:

|  |  |  |
|---|---|---|
| 0.1532 | 0.0000 | −0.1532 |
| 0.0000 | 0.1532 | −0.1532 |
| −0.1532 | −0.1532 | 0.3142 |

Figure 6A:
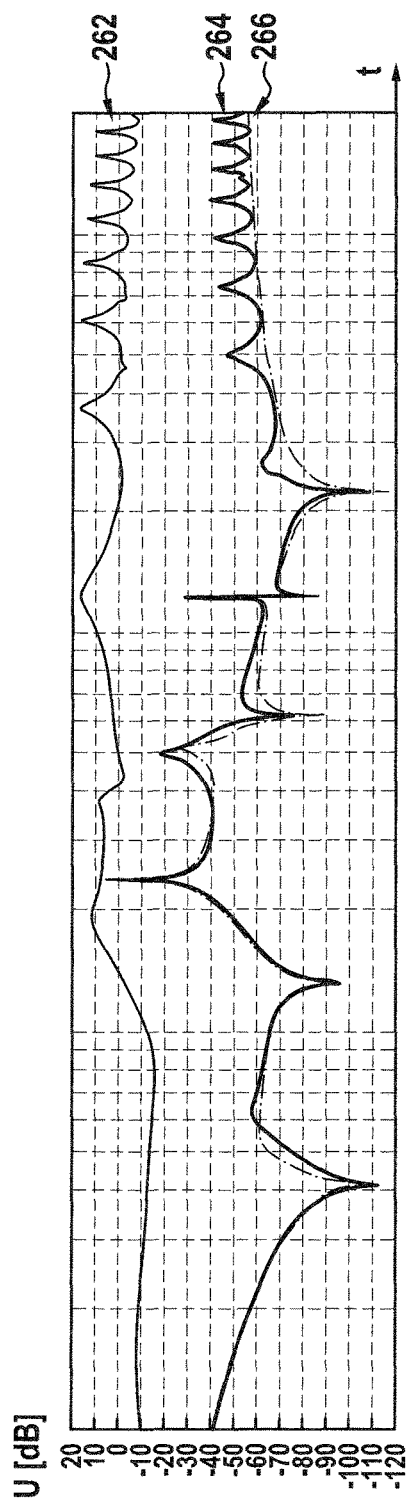
FIG. 6A shows a first diagram with interference voltages.
Figure 6B:
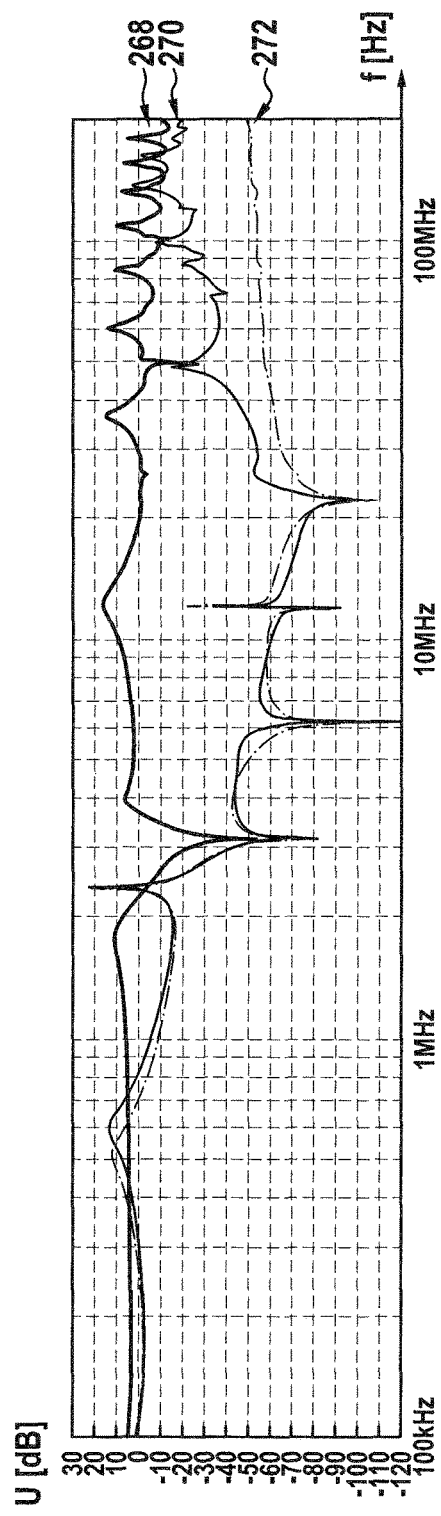
FIG. 6B shows a second diagram with interference voltages.

Reference is made to FIGS. 6A and 6B, where FIG. 6A has differential-mode interference voltages and FIG. 6B has common-mode interference voltages. The frequency is plotted on the abscissa, and the voltage level on the ordinate in dB. The curve 264 shows the differential-mode interference signal without filtering. The curve 264 shows the differential-mode interference signal if only the conventional high-voltage filter 240 according to the prior art is used to damp the differential-mode interference signal 262. The curve 266 shows the remaining differential-mode interference signal if both the conventional high-voltage filter 240 and the damping device 200 according to the invention are used.

The curve 268 shows the level of the common-mode interference without damping. The curve 270 shows the level of the common-mode inference if only the conventional high-voltage filter 240 according to the prior art is used. The curve 272 shows the remaining common-mode interference if both the conventional high-voltage filter 240 and the damping device according to the invention are used to damp the common-mode interference.

These exemplary measurements have been determined in a line between a battery 250 and an inverter 260. The common-mode interferences and the differential-mode interferences have a plurality of resonances as a result of circuits in the lower frequency range and a plurality of housing resonances and cable harness resonances at frequencies higher than 20 MHz. The damping device 200 according to the invention damps the modes effectively without changing the resonance behavior of the cable. The common-mode interference can be reduced by up to 50 decibels.

Figure 7:
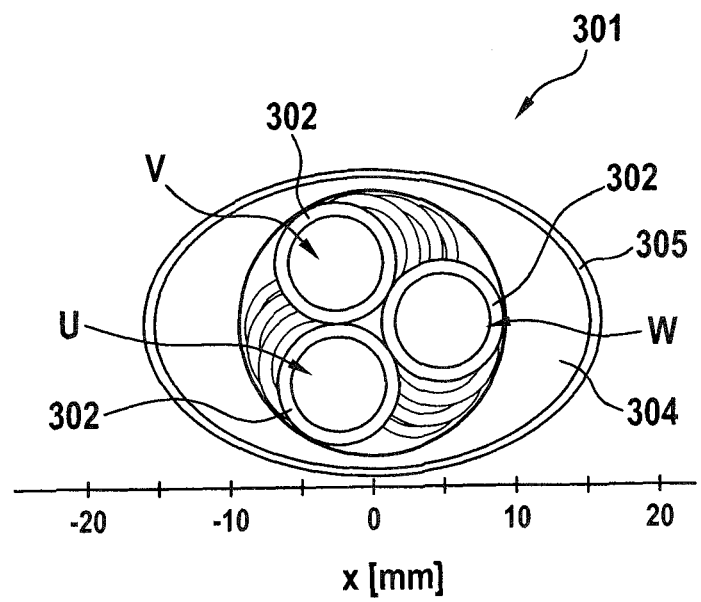
FIG. 7 is a schematic section diagram through a high-voltage alternating current line of a vehicle with an electric drive.
Figure 8:
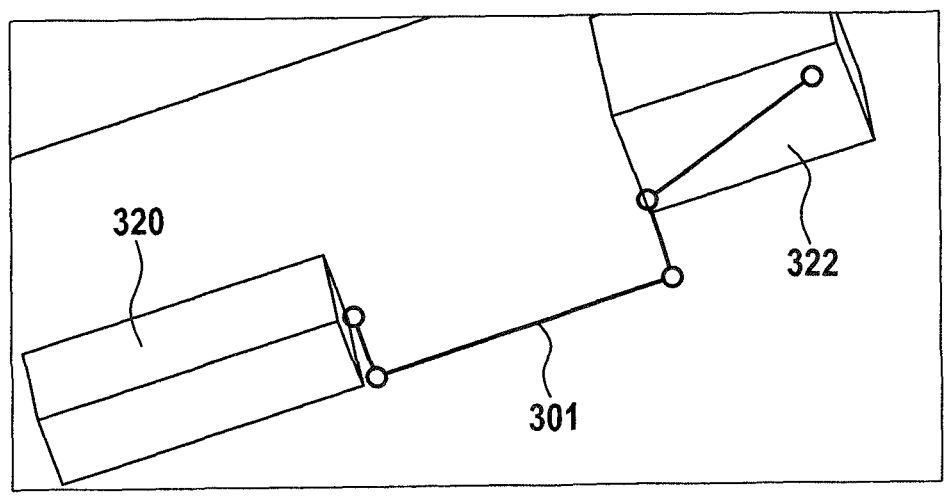
FIG. 8 is an exemplary routing of a cable in a vehicle.
Figure 9:
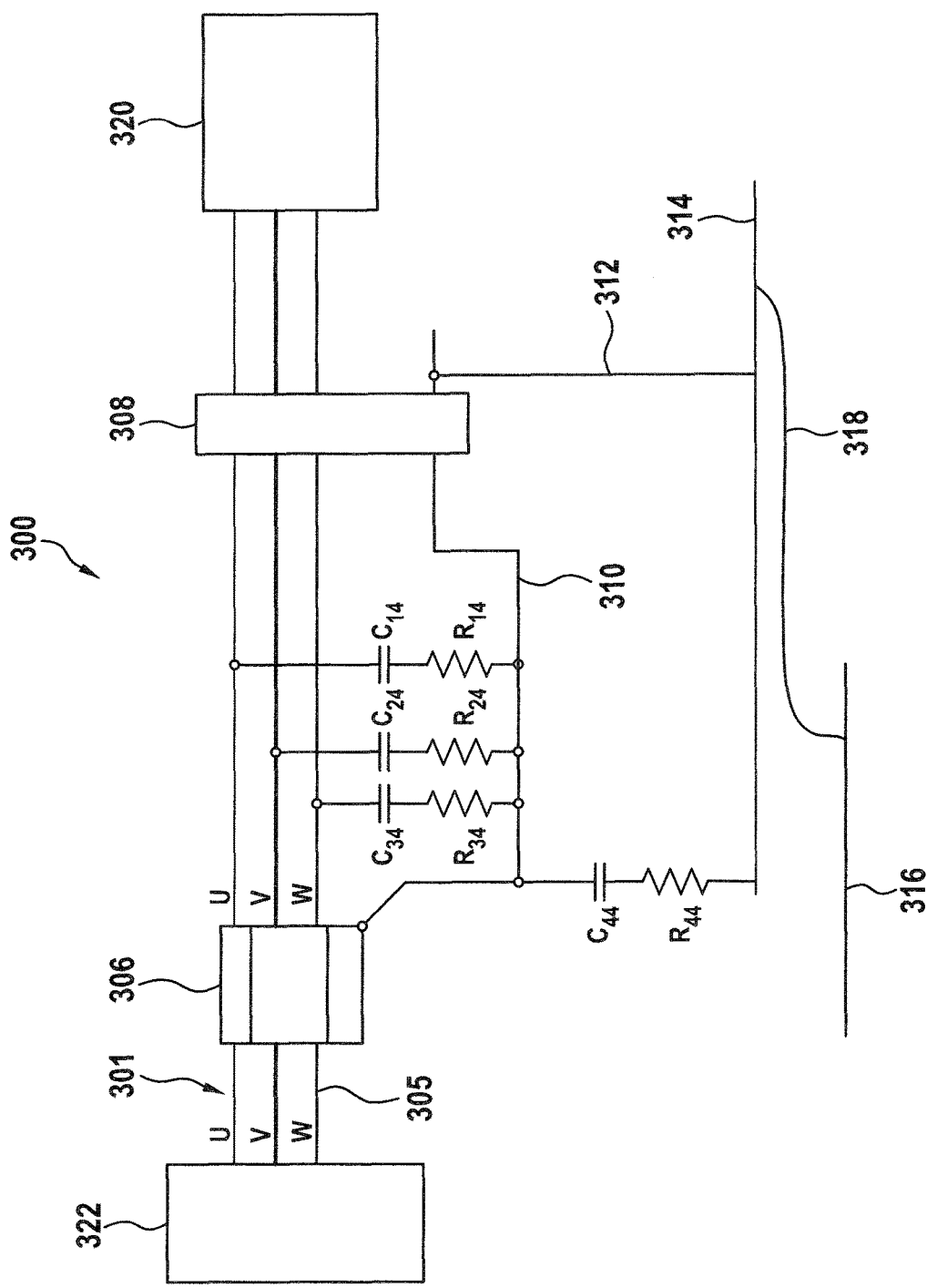
FIG. 9 is a circuit diagram of a damping device for a three-wire high-voltage line.

Reference is made to FIGS. 7, 8 and 9 which show a three-wire high-voltage line, with FIG. 7 showing a section through the three-wire high-voltage line 301, FIG. 8 showing the routing of the three-wire cable 301, and FIG. 9 showing a connection of the damping device 300 according to the invention. The high-voltage line 301 comprises three wires U, V, W, around each of which an insulator element 302 is arranged. The three lines U, V, W are twisted with one another and embedded in a plastic 304. A shield 305 is arranged around the plastic. It goes without saying that a further insulation layer can be provided outside the cable harness shield 305. FIG. 8 shows exemplary routing of the high-voltage line from an inverter 320 to an electric machine 322.

The high-voltage line 301 from the electric machine 322 is connected to a plug 306. The wire U is connected via a series circuit of a capacitor $C_{14}$ and a resistor $R_{14}$ to a cable harness shield ground 310 which is connected to the cable harness shield 305 via the plug 306. The wire V is connected to the cable harness shield ground 310 via a series circuit composed of a capacitor $C_{24}$ and a resistor $R_{24}$. The wire W is connected to the cable harness shield ground 310 via a capacitor $C_{34}$ and a resistor $R_{34}$. The cable harness shield ground 310 forms a wire. The wires U, V, W and the cable harness shield 310 are damped by a ferrite core 308. The cable harness shield ground 310 is connected to the housing shield 314 via a series circuit composed of a capacitor $C_{44}$ and a resistor $R_{44}$. The housing shield is connected to the cable harness shield ground 310 via a housing ground 312 and the ferrite core 308. The housing shield ground 314 is connected via a cable 318 to the bodywork 316 which forms the actual ground of the vehicle.

The damping device 300 for a high voltage AC line is also an important device of the total filter topology which damps the resonances in lines leading to an electric machine or a high-voltage starter. The approach is suitable for all three-wire cable types. The high-voltage AC line 301 comprises three phase conductors U, V, W and a cable harness shield 305 as a collective shield. The high-voltage AC line can be described with a 4×4 matrix with modal wave impedances. Since the shield cross section is not constant and the high-voltage AC cable 301 is laid in a complex fashion in the vehicle, such a line is non-homogeneous, i.e. the interference behavior cannot be generalized. Nevertheless, the scatter matrix can be determined by means of a network analyzer. In particular the common-mode current damping is relevant for such a high-voltage AC line 301. Consequently, the scatter matrix comprises merely four wave impedances based on the common-mode interference.

The scatter matrix S has the following values:

|  |  |  |  |  |  |  |  |
|---|---|---|---|---|---|---|---|
| $-1.4331\,10^1$ | $-7.9633$ | $-7.9641$ | $-1.5401\,10^1$ | $-2.8268$ | $-2.8111\,10^1$ | $-2.8110\,10^1$ | $-1.7536\,10^1$ |
| $-7.9633$ | $-1.2335\,10^1$ | $-8.0873$ | $-1.4407\,10^1$ | $-2.7142\,10^1$ | $-3.0207$ | $-2.8185\,10^1$ | $-1.8109\,10^1$ |
| $-7.9641$ | $-8.0873$ | $-1.2338\,10^1$ | $1.4408\,10^1$ | $-2.7146\,10^1$ | $-2.8190\,10^1$ | $-3.0201$ | $-1.8108\,10^1$ |
| $-1.5401\,10^1$ | $-1.4407\,10^1$ | $-1.4408\,10^1$ | $-2.8043$ | $-2.6129\,10^1$ | $-3.2101\,10^1$ | $-3.2089\,10^1$ | $-4.4930$ |
| $-2.8268$ | $-2.8111\,10^1$ | $-2.8110\,10^1$ | $-1.7536\,10^1$ | $-1.3525\,10^1$ | $-8.3955$ | $-8.3964$ | $-1.1819\,10^1$ |
| $-2.7142\,10^1$ | $-3.0207$ | $-2.8185\,10^1$ | $-1.8109\,10^1$ | $-8.3955$ | $-1.1748\,10^1$ | $-8.5136$ | $-1.1410\,10^1$ |
| $-2.7146\,10^1$ | $-2.8190\,10^1$ | $-3.0201$ | $-1.8108\,10^1$ | $-8.3964$ | $-8.5136$ | $-1.1750\,10^1$ | $-1.1410\,10^1$ |
| $-2.6129\,10^1$ | $-3.2101\,10^1$ | $-3.2089\,10^1$ | $-4.4930$ | $-1.1819\,10^1$ | $-1.1410\,10^1$ | $-1.1410\,10^1$ | $-4.5351$ |

Unit: dB

With the circuit shown in FIG. 9 the following values are obtained:
$R_{14} = 55\,\Omega$, $R_{24} = 55\,\Omega$, $R_{34} = 63\,\Omega$, $R_{44} = 18\,\Omega$, $C_{14} = C_{24} = C_{34}$ is = 100 pF, $C_{44} = 10$ nF;
wherein the wave admittance matrix has the following values:

|  |  |  |  |
|---|---|---|---|
| $3.8423\,10^{-2}$ | $-1.5343\,10^{-2}$ | $-1.5340\,10^{-2}$ | $-6.0786\,10^{-3}$ |
| $-1.5182\,10^{-2}$ | $4.2597\,10^{-2}$ | $-1.5676\,10^{-2}$ | $-1.0918\,10^{-2}$ |
| $-1.5179\,10^{-2}$ | $-1.5675\,10^{-2}$ | $4.2591\,10^{-2}$ | $-1.0915\,10^{-2}$ |
| $-9.6681\,10^{-3}$ | $-1.3501\,10^{-2}$ | $-1.3496\,10^{-2}$ | $8.5735\,10^{-2}$ |

The AC dielectric strength is a critical problem in the case of high-voltage AC filtering. Customary capacitors which are used for electromagnetic compatibility and which have a capacitance of more than 1 nF are problematic in the case of voltages of over 400 V and in a frequency range from approximately 800 Hz to approximately 1500 Hz, which are typical values in a vehicle inverter 320. In addition, such capacitors with a capacitance in the pF range are not effective when filtering. Since the damping effect in the present invention is achieved mainly or only by means of the resistances, capacitors with a low capacitance can be used without reducing the damping effect.

Figure 10:
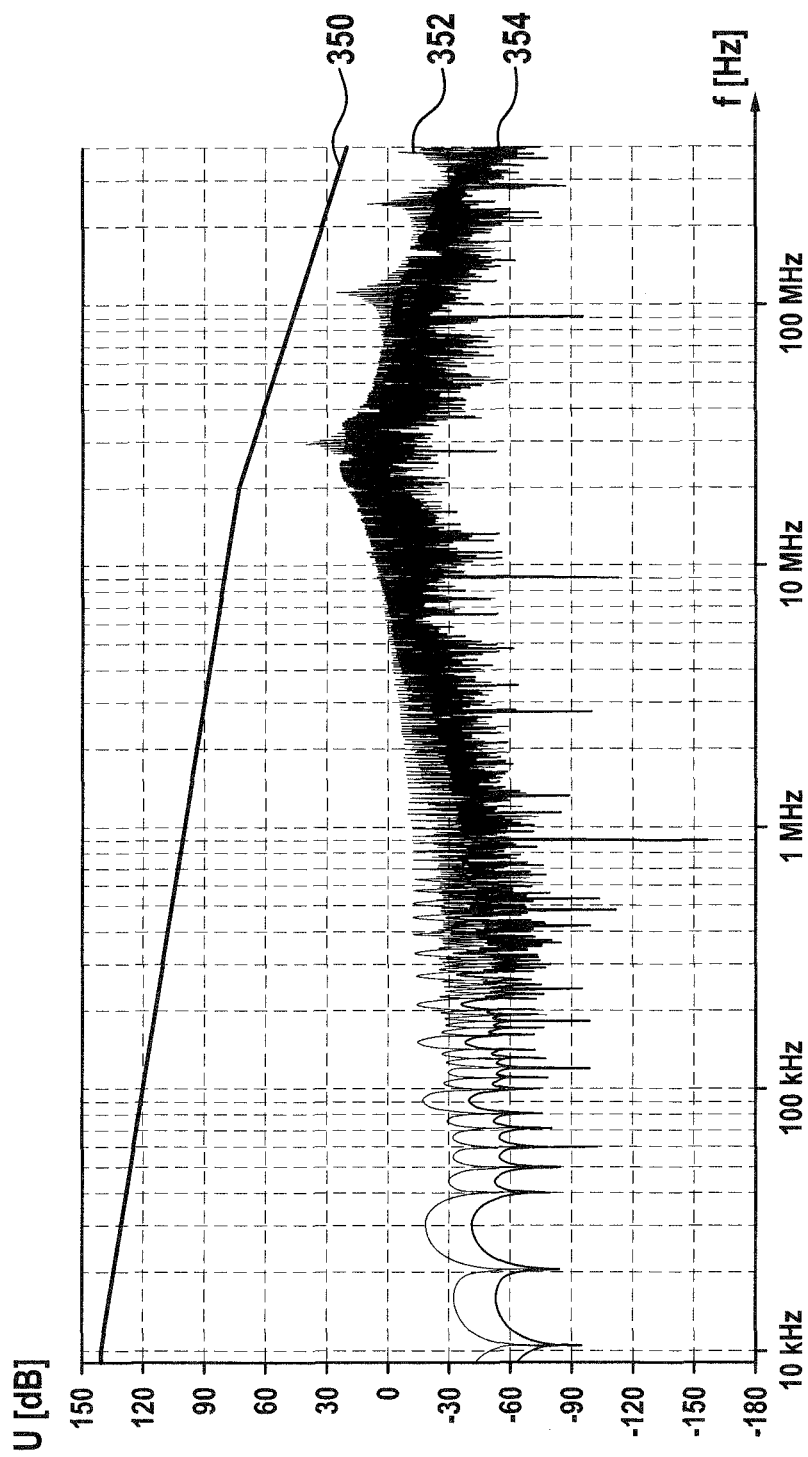
FIG. 10 is a graph showing interference voltages in the case of a three-wire high-voltage line.

Reference is made to FIG. 10 which shows a diagram of interference signals. The frequency is plotted on the abscissa. The level of the interference spectrum is plotted in dBuV on the ordinate. The curve 350 shows the input interference spectrum at the power transistors which may be, for example, IGBT. The curve 352 shows the interference voltage on the housing of the electric machine 322 without damping. The line resonances of the wires U, V, W can be clearly seen. In particular, the shield conductor resonance at approximately 28 MHz is problematic, said shield conductor resonance giving rise to relatively high longitudinal impedance in the cable shield. The curve 354 shows the common-mode interference after it has been damped by means of the damping device 300 according to the invention.

The present invention can also be applied to a high-voltage common-mode line or a three-phase high-voltage AC line with double shielding. In this case, each shield forms a wire in the sense of the calculation by means of the scatter parameters and the chain matrix. Likewise, the invention can be applied for a damping device for a high-voltage DC line with individual shielding of both wires in one shield. It goes without saying that the invention can also be applied in a damping device for an AC charging device.

Figure 11:
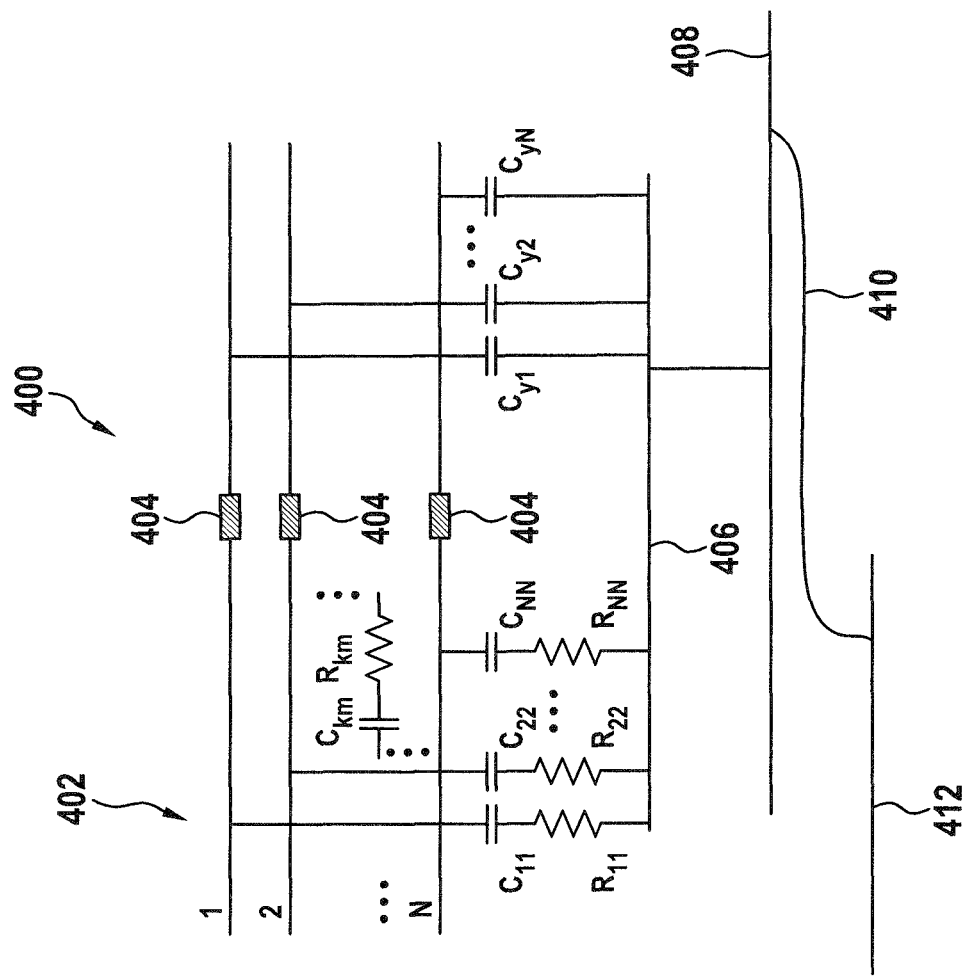
FIG. 11 shows a damping device in the case of a low-voltage signal cable harness.

Reference is made to FIG. 11 which shows a further embodiment of the invention. A low-voltage signal cable 420 is damped with the damping device 400 shown in FIG. 11. The low-voltage signal cable can be a cable harness with N wires. A series circuit composed of a capacitor $C_{11}$ and a resistor $R_{11}$, also connected to a housing ground 406, is connected to the first wire of the low-voltage signal cable. A second series circuit composed of a capacitor $C_{22}$ and a resistor $R_{22}$ is connected between the second wire of the low-voltage signal cable and the housing ground 406. A further series circuit composed of a capacitor $C_{NN}$ and a resistor $R_{NN}$ is connected to the wire N of the low-voltage signal cable 402 and to the housing ground 406.

A damping inductance 404, which can be, for example, an SMD ferrite, is connected into each wire. The first input of the inductance 404 in the first wire of the low-voltate signal cable is connected to the capacitor $C_{11}$, and the second terminal of this inductance 404 is connected to a capacitor $C_{y1}$, the other terminal of which is connected to the housing ground 406. The first terminal of the inductance 404 in the second wire of the low-voltage signal cable 402 is connected to a capacitor $C_{22}$, and the second terminal of the inductance 404 is connected to a capacitor $C_{y2}$, the other terminal of which is connected to the housing ground 406. The first terminal of the inductance 404 in the wire N is connected to a capacitor $C_{NN}$, and the second terminal of this inductance is connected to a capacitor $C_{yN}$, the other terminal of which is connected to the housing ground 406. The housing ground 406 is connected to the housing shield 408, wherein the housing shield 408 is connected via a cable to the bodywork 412 which forms the actual ground of the motor vehicle.

This embodiment of the damping device 400 is suitable for cases in which the resonances in the low-voltage signal cable 402 are critical for the entire vehicle. The modal wave impedances of the low-voltage signal cable 402 to the bodywork ($R_{kk}$, k=1:N) eliminate all the common-mode resonances. If some differential-mode resonances are known between the wire pairs, these differential-mode resonances can be eliminated by means of additional modal impedances. The inductances 404 between the wave damping device, which are formed by the series circuit composed of capacitor $C_{kk}$ and resistor $R_{kk}$, and the EMC filter which is formed by the capacitors $C_y$, serve for high-frequency damping.

The invention provides an improved damping device for a motor vehicle, since it also takes into account the properties of the cable and of the cable harness.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A damping device to damp interference signals in a cable having a plurality of wires, comprising:
    a plurality of first terminals to which a voltage vector $U_1$ is applied and at which a current vector $I_1$ flows, wherein a wire of the cable is connected to every first terminal;
    a plurality of second terminals to which a voltage vector $U_2$ is applied and at which a current vector $I_2$ flows, wherein a wire of the cable is connected to every second terminal; and
    a first plurality of dipoles whose first terminal is connected to a wire k and whose second terminal is connected to ground,
    wherein the following applies:

$$\overline{A} = \begin{pmatrix} \overline{A}_{11} & \overline{A}_{12} \\ \overline{A}_{21} & \overline{A}_{22} \end{pmatrix}, \quad \text{(I)}$$

$$\begin{pmatrix} \overline{U_1} \\ \overline{I_1} \end{pmatrix} = \begin{pmatrix} \overline{A}_{11} & \overline{A}_{12} \\ \overline{A}_{21} & \overline{A}_{22} \end{pmatrix} \cdot \begin{pmatrix} \overline{U_2} \\ \overline{I_2} \end{pmatrix}; \quad \text{(II)}$$

$$\overline{Y}_w = \sqrt{\overline{A}_{21} \overline{A}_{12}^{-1}} = \{y_{km}\}, k, m = \overline{1, n}; \quad \text{(III)}$$

wherein $\overline{A}$ is a chain matrix of an entirety of the cable, $\overline{Y}_w$ is an admittance matrix of the entirety of the cable, and
a resistance and a reactance of the dipoles are determined as follows:

$$Z_{k,m} = \begin{cases} -\dfrac{1}{y_{k,m}}, & k \neq m, \\ 1 \Big/ \sum_{i=1:n} y_{k,i}, & k = m. \end{cases} \quad \text{(IV)}$$

2. The damping device according to claim 1, further comprising:

a second plurality of dipoles whose first terminal is connected to the wire k and whose second terminal is connected to a wire m.

3. The damping device according to claim 1, wherein a wire is a first shield which shields at least one other wire.

4. The damping device according to claim 3, wherein
the first shield is connected to ground via a dipole ($Z_{kk}$), and the wires of the cable are each connected to the first shield via a dipole ($Z_{km}$) or,
the first shield is connected to a second shield via a dipole ($Z_{kk}$) and the wires of the cable are each connected to the first shield via a dipole ($Z_{km}$).

5. The damping device according to claim 1, wherein the dipole has a real resistance and a capacitance.

6. The damping device according to claim 4, wherein the damping device comprises at least one of:
at least one inductance which is connected to a wire;
at least one component which acts as an inductance and is arranged around a plurality of wires of the cable; and
at least one component which acts as an inductance and is arranged around all the wires of the cable apart from the second shield.

7. A motor vehicle, comprising:
an electric drive; and
the damping device according to claim 4.

8. The motor vehicle according to claim 7, wherein
the first shield is a cable harness ground, and the second shield is a housing shield which is connected to a bodywork of the vehicle.

9. The motor vehicle according to claim 8, wherein
the dipoles ($Z_{kk}$) are connected to the first shield and each wire is coupled to the first shield by a second capacitance ($C_y$), wherein in each wire an inductance is connected between the dipole and the second capacitance ($C_y$).

10. The motor vehicle according to claim 7, wherein
the dipoles ($Z_{kk}$) are connected to the first shield and each wire is coupled to the first shield by a second capacitance ($C_y$), wherein in each wire an inductance is connected between the dipole and the second capacitance ($C_y$).

11. A method for determining a resistance and a reactance of dipoles ($Z_{km}$, $Z_{kk}$) of a damping device for a cable having a plurality of wires, wherein the damping device comprises:

a plurality of first terminals to which a voltage vector $U_1$ is applied and at which a current vector $I_1$ flows, wherein a wire of the cable is connected to every first terminal;
a plurality of second terminals to which a voltage vector $U_2$ is applied and at which a current vector $I_2$ flows, wherein a wire of the cable is connected to every second terminal;
a first plurality of dipoles ($Z_{kk}$) whose first terminal is connected to a wire k and whose second terminal is connected to ground;
an optional second plurality of dipoles ($Z_{km}$) whose first terminal is connected to the wire k and whose second terminal is connected to a wire m;
the method comprising the steps of:
determining S parameters of an entirety of the cable by a measurement or a computer-implemented calculation;
determining a chain matrix $\overline{A}$ of the entirety of the cable from the S parameters, where the following applies:

$$\overline{A} = \begin{pmatrix} \overline{A}_{11} & \overline{A}_{12} \\ \overline{A}_{21} & \overline{A}_{22} \end{pmatrix}, \quad \text{and} \tag{I}$$

$$\begin{pmatrix} \overline{U_1} \\ \overline{I_1} \end{pmatrix} = \begin{pmatrix} \overline{A}_{11} & \overline{A}_{12} \\ \overline{A}_{21} & \overline{A}_{22} \end{pmatrix} \cdot \begin{pmatrix} \overline{U_2} \\ \overline{I_2} \end{pmatrix}; \tag{II}$$

determining an admittance matrix $\overline{Y}$ by the following equation:

$$\overline{Y}_w = \sqrt{\overline{A}_{21} \overline{A}_{12}^{-1}} = \{y_{km}\} k,m=\overline{1,n}; \text{ and} \tag{III}$$

determining a resistance and a reactance of the dipoles ($Z_{km}$, $Z_{kk}$) by the following equations:

$$Z_{k,m} = \begin{cases} -\dfrac{1}{y_{k,m}}, & k \neq m, \\ 1 \Big/ \sum_{i=1:n} y_{k,i}, & k = m. \end{cases} \tag{IV}$$

12. The damping device according to claim 1, further comprising:
an inductive isolator device connected to the cable.

* * * * *